(12) United States Patent
Senouci et al.

(10) Patent No.: US 12,381,516 B2
(45) Date of Patent: Aug. 5, 2025

(54) VERSATILE LOW NOISE AMPLIFIER AND METHOD THEREFOR

(71) Applicant: SEMICONDUCTOR COMPONENTS INDUSTRIES, LLC, Phoenix, AZ (US)

(72) Inventors: Noureddine Senouci, Le Landeron (CH); Onur Kazanc, Boudry (CH); Alexander Heubi, La Chaux-de-Fonds (CH)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 608 days.

(21) Appl. No.: 17/657,535

(22) Filed: Mar. 31, 2022

(65) Prior Publication Data

US 2023/0060050 A1  Feb. 23, 2023

Related U.S. Application Data

(60) Provisional application No. 63/260,428, filed on Aug. 19, 2021.

(51) Int. Cl.
*H03F 3/04* (2006.01)
*H03F 1/26* (2006.01)
(Continued)

(52) U.S. Cl.
CPC .............. *H03F 1/26* (2013.01); *H03F 3/193* (2013.01); *H03F 3/211* (2013.01);
(Continued)

(58) Field of Classification Search
CPC . H03F 1/26; H03F 3/193; H03F 3/211; H03F 3/45179; H03F 2200/294; H03F 3/45475; H04B 17/318
See application file for complete search history.

(56) References Cited

U.S. PATENT DOCUMENTS 6,311,049 B1 * 10/2001 Yoshizawa ........... H03G 3/3052
342/380
6,750,715 B2 * 6/2004 Allott ..................... H03G 7/001
330/296

(Continued)

OTHER PUBLICATIONS

Huang, Po-Chiun et al., "A 2-V 10.7-MHz CMOS Limiting Amplifier/RSSI," EEE Journal of Solid-State Circuits, vol. 35, No. 10, Oct. 2000.

(Continued)

*Primary Examiner* — Khanh V Nguyen
(74) *Attorney, Agent, or Firm* — Polansky & Associates, P.L.L.C.; Paul J. Polansky

(57) ABSTRACT

A low noise amplifier includes a plurality of serially-coupled amplifier stages. Each serially-coupled amplifier stage provides a respective amplified signal, wherein a first amplifier stage receives an input signal, and a last amplifier stage provides an amplified output signal. Each serially-coupled amplifier stage includes a single-ended amplifier having an input, and an output providing the respective amplified signal, a first passive network, and a second passive network. The first passive network has a first terminal forming an input of a respective one of said plurality of serially-coupled amplifier stages, and a second terminal coupled to said input of said single-ended amplifier, the first passive network including a first capacitor coupled in series between the first and said second terminals of the first passive network. The second passive network is coupled in parallel to the single-ended amplifier and between the input and the output of the single-ended amplifier.

18 Claims, 6 Drawing Sheets

(51) Int. Cl.
*H03F 3/193* (2006.01)
*H03F 3/21* (2006.01)
*H03F 3/45* (2006.01)
*H04B 17/318* (2015.01)

(52) U.S. Cl.
CPC ....... *H03F 3/45179* (2013.01); *H04B 17/318* (2015.01); *H03F 2200/294* (2013.01)

(56) References Cited

U.S. PATENT DOCUMENTS

| | | | |
|---|---|---|---|
| 6,940,354 B2* | 9/2005 | Kang | H03F 3/605 |
| | | | 330/310 |
| 7,176,757 B2* | 2/2007 | Nakatani | H03F 1/3276 |
| | | | 330/107 |
| 7,456,667 B2* | 11/2008 | Taylor | H03K 5/156 |
| | | | 327/263 |
| 7,668,514 B2 | 2/2010 | Ojo et al. | |
| 7,978,007 B2* | 7/2011 | Tiiliharju | H03F 1/342 |
| | | | 330/98 |
| 8,513,997 B2* | 8/2013 | Hesen | H03K 5/1565 |
| | | | 327/175 |
| 8,860,491 B1* | 10/2014 | Li | H03M 3/442 |
| | | | 327/344 |
| 10,630,309 B1* | 4/2020 | Fan | H03M 1/1285 |
| 2014/0117974 A1* | 5/2014 | Chou | H04B 17/318 |
| | | | 324/123 R |

OTHER PUBLICATIONS

Action on the Merits by U.S.P.T.O regarding U.S. Appl. No. 17/657,540, filed Mar. 31, 2022.

* cited by examiner

VERSATILE LOW NOISE AMPLIFIER AND METHOD THEREFOR

This application claims the benefit of U.S. Provisional Patent Application No. 63/260,428, filed on Aug. 19, 2021, the entire contents of which are incorporated herein by reference.

CROSS REFERENCE TO RELATED APPLICATION

Related subjected matter is found in U.S. patent application Ser. No. 17/657,540, filed Mar. 31, 2022, invented by the inventors hereof and assigned to the assignee hereof.

FIELD OF THE DISCLOSURE

This disclosure relates generally to amplifiers, and more specifically to low noise amplifiers useful in various radio frequency (RF) and intermediate frequency (IF) communications systems, such as front-end low noise amplifiers and limiting amplifiers of receive signal strength indicator (RSSI) circuits.

BACKGROUND

Low-noise amplifiers, or LNAs, are electronic amplifiers that amplify a low-power signal without introducing significant noise or distortion. An LNA is typically used at the front-end of a radio receiver to amplify a broadband signal spectrum before the signal is mixed to a lower intermediate frequency for further signal processing.

Modern integrated circuits are predominantly implemented using complementary metal-oxide-semiconductor (CMOS) transistor technology because of its small area requirements and relatively fast operation. While CMOS LNAs use these advantages for amplifying received signals, they typically suffer from voltage offsets due to mismatches in actual transistor sizes and electrical properties such as threshold voltages once the integrated circuit is manufactured. Because of these mismatches, receive signal strength indicator (RSSI) circuits using CMOS amplifiers typically implement offset cancellation, in which the mismatch is measured and compensated by using feedback. However, implementation of offset cancellation increases the circuit area, complexity, and power consumption of these conventional RSSI circuits

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
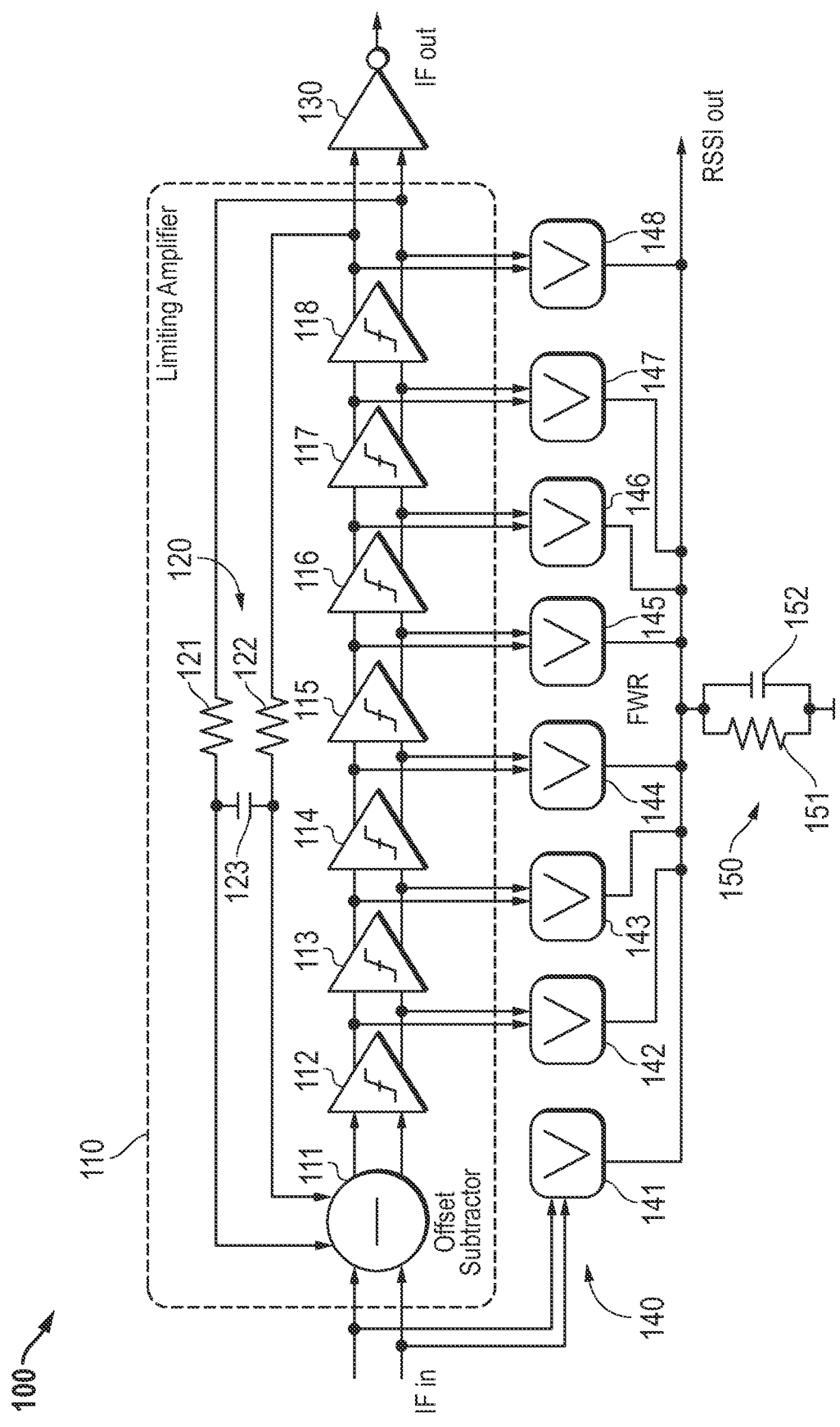
FIG. 1 illustrates in partial block diagram and partial schematic form a conventional receive signal strength indicator (RSSI) circuit known in the prior art.

FIG. 1 illustrates in partial block diagram and partial schematic form a receive signal strength indicator (RSSI) circuit 100 known in the prior art. RSSI circuit 100 includes generally a limiting amplifier 110, an output amplifier 130, a full wave current rectifier stage 140, and an output load 150.

Limiting amplifier 110 includes an offset subtractor 111, a series of amplifier stages 112-118, and a feedback filter 120. Offset subtractor 111 include first and second signal inputs for receiving positive and negative components of a differential intermediate frequency signal labelled "IFin", first and second feedback inputs for receiving positive and negative components of a differential feedback signal, and first and second outputs for providing positive and negative components of a difference signal. Amplifier stages 112-118 are differential amplifiers connected serially between the output of offset subtractor 111 and the input of limiting amplifier 110. Amplifier 112 has positive and negative inputs connected to the first and second outputs of offset subtractor 111 for receiving the positive and negative components of the difference signal, and first and second outputs for providing positive and negative components of a differential output signal of amplifier stage 112. Each of amplifiers 113-117 are connected in the same manner. Amplifier 118 has positive and negative inputs connected to the first and second outputs of amplifier 117, and first and second outputs for providing positive and negative components of a differential output signal of amplifier stage 118. Feedback filter 120 includes resistors 121 and 122, and a capacitor 123. Resistor 121 has a first terminal connected to the second output of amplifier stage 118, and a second terminal connected to the second feedback terminal of offset subtractor 111. Resistor 122 has a first terminal connected to the first output of amplifier stage 118, and a second terminal connected to the first feedback terminal of offset subtractor 111. Capacitor 123 has a first terminal connected to the second terminal of resistor 121, and a second terminal connected to the second terminal of resistor 122.

Output amplifier 130 has first and second inputs connected to the first and second outputs of amplifier stage 118, and an output for providing a signal labelled "IF out".

Full wave current rectifier stage 140 includes current rectifiers 141 through 148. Current rectifier 141 has first and second inputs for receiving the positive and negative components of the differential input signal IFin, and a current output. Each of current rectifiers 142-148 has first and second inputs connected to the first and second outputs of a corresponding one of amplifiers stages 112-118, and a current output connected together and to the output of current rectifier 141.

Output load 150 includes a resistor 151 and a capacitor 152. Resistor 151 has a first terminal connected to the outputs of each of current rectifiers 141-148, and a second terminal connected to ground. Capacitor 152 has a first terminal connected to the outputs of each of current rectifiers 142-148, and a second terminal connected to ground.

RSSI circuit 100 has several problems. First, it uses current sensing from the outputs of a series of current rectifiers, and the summed currents are driven into a load. These operations cause RSSI circuit 100 to consume a significant amount of power and to have a significant circuit size. Second, RSSI circuit 100 uses differential signaling with CMOS technology, subjecting the amplifiers to offsets from component mismatch, in which the offsets accumulate and are amplified through succeeding stages of the limiting amplifier. In order to compensate for the offsets, limiting amplifier 110 adds an offset subtractor, which increases circuit complexity and lengthens settling time. Third, the load itself can be large and may require, for example, an off-chip capacitor to convert the summed currents into a voltage.

Figure 2:
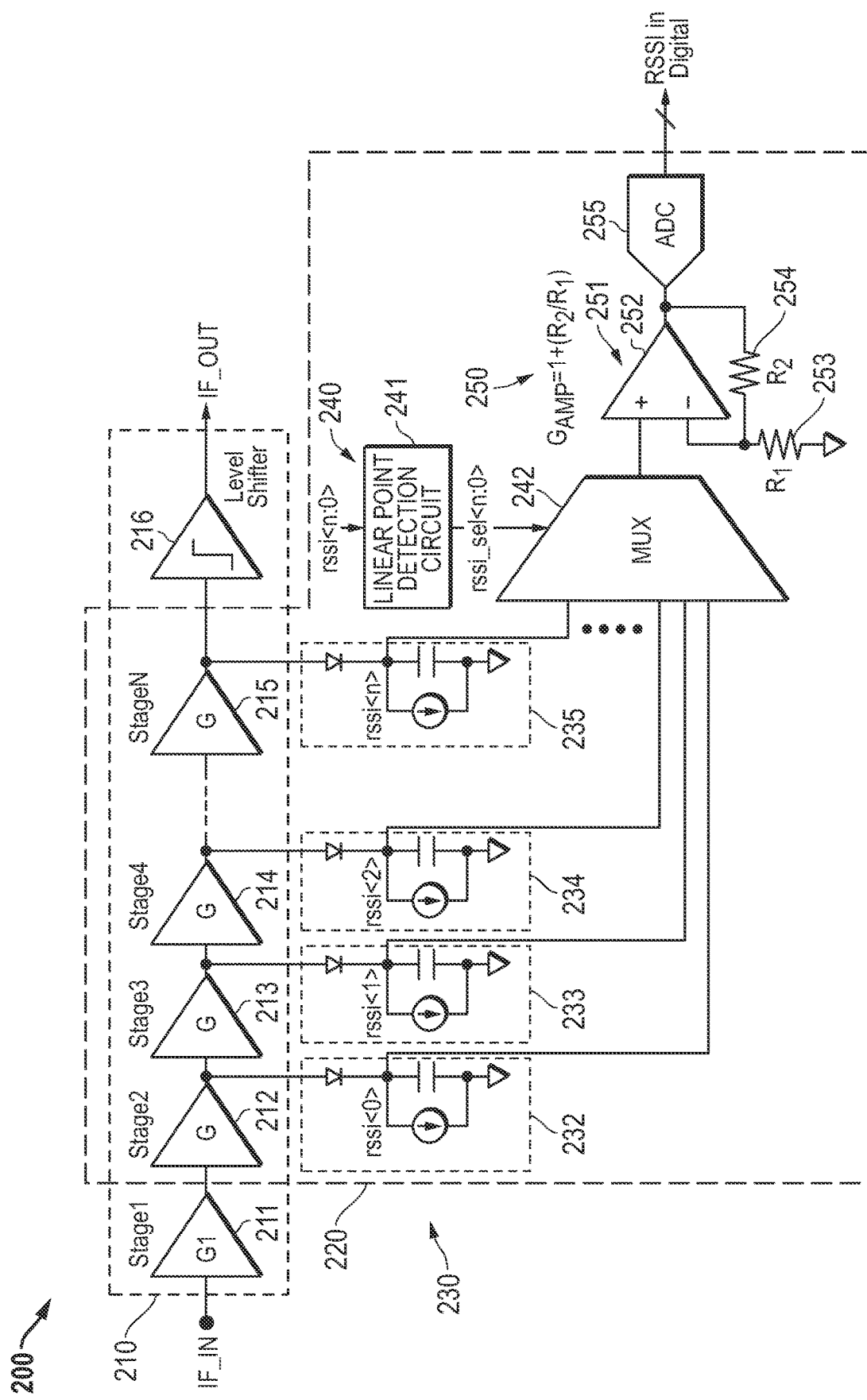
FIG. 2 illustrates in partial block diagram and partial schematic form an integrated low noise amplifier (LNA) and receive signal strength indicator (RSSI) circuit according to various embodiments of the present application.

FIG. 2 illustrates in partial block diagram and partial schematic form an integrated low noise amplifier (LNA) and receive signal strength indicator (RSSI) circuit 200 according to various embodiments of the present application. Integrated LNA and RSSI circuit 200 includes generally an LNA 210 and an overlapping RSSI circuit 220.

LNA 210 has an input for receiving a single-ended input intermediate frequency input signal labelled "IF_IN", and an output for providing an amplified intermediate frequency output signal labelled "IF_OUT". In alternate embodiments, LNA 210 is also suitable for operation as an LNA that receives a relatively low radio frequency (RF) signal, e.g., at a carrier frequency on the order of tens of mega-Hertz (MHz) or less, at an input of an RF receiver. LNA 210 is implemented as a set of serially-connected amplifier stages 211-215, and a single-ended input to single-ended output level shifter 216. Amplifier stage 211 is a single-ended input to single-ended output amplifier stage having an input for receiving IF_IN, and an output. Each of amplifier stages 212-215 is a single-ended input to single-ended output amplifier stage having an input connected to the output of a previous amplifier stage, and a single-ended output. Level shifter 216 has an input connected to the output of amplifier stage 215, and an output for providing signal IF_OUT.

RSSI circuit 220 shares amplifier stages 212-215 with LNA 210 and uses them as a limiting amplifier. RSSI circuit 220 also includes an envelope detector stage 230, a selection circuit 240, and an output stage 250. Envelope detector stage 230 includes envelope detector circuits 232-235 connected to the outputs of amplifier stages 212-215, respectively. Envelope detector 232 has an input connected to the output of amplifier stage 212, and an output for providing a signal labelled "rssi<0>". Envelope detector 233 has an input connected to the output of amplifier 213, and an output for providing a signal labelled "rssi<1>". Envelope detector 234 has an input connected to the output of amplifier 214, and an output for providing a signal labelled "rssi<2>". Envelope detector 235 has an input connected to the output of amplifier 215, and an output for providing a signal labelled "rssi<n>". As shown in FIG. 2, each envelope detector circuit includes a diode, a current source, and a capacitor. The diode has an anode connected to the output of the respective amplifier, and a cathode that provides the respective rssi component. The current source and capacitor are connected in parallel to each other and each has a first terminal connected to the anode of the corresponding diode, and a second terminal connected to ground.

Selection circuit 240 includes a linear point detection circuit 241 and a multiplexer 242 labelled "MUX". Linear point detection circuit 241 has an input for receiving the rssi<n:0> voltages from the corresponding envelope detector circuits, and an output for providing a rssi selection signal labelled rssi_sel<n:0>. Multiplexer 242 has signal inputs for receiving the rssi<n:0>voltages from the corresponding envelope detector circuits, a control input connected to the output of linear point detection circuit 241, and an output for providing as a detected RSSI signal a receive signal strength indicator component of one of the envelope detector circuits having a desired linear range. Linear point detection circuit 241 provides one of the rssi_sel<n:0>signals in an active state, while keeping all remaining ones in an inactive state. Thus, linear point detection circuit 241 provides a one-hot output signal.

Output stage 250 includes an amplifier 251 and an analog-to-digital converter (ADC) 255. Amplifier 251 includes an operational amplifier 252 and resistors 253 and 254. Operational amplifier 252 has a non-inverting input connected to the output of multiplexer 242, an inverting input, and an output. Resistor 253 has a first terminal connected to the non-inverting input of operational amplifier 252, and a second terminal connected to ground, and has an associated resistance $R_1$. Resistor 254 has a first terminal connected to the non-inverting input of operational amplifier 252, and a second terminal connected to the output terminal of operational amplifier 252, and has an associated resistance $R_2$.

In operation, amplifier stages 212-215 function together as a limiting amplifier for RSSI circuit 220. The overall LNA gain is given by Equation 111:

$$G_{(LNA)}=G_1+G_{212}+G_{213}+G_{214}+\ldots G_{215} \quad [1]$$

However, as shown in FIG. 2, amplifier stage 211 has a gain labelled "G1", whereas each of stages 212-215 has a gain labelled "G".

The RSSI dynamic range is given by Equation [2]:

$$DR_{(RSSI)}=G_{212}+G_{213}+G_{214}+\ldots G_{215} \quad [2]$$

In some embodiments, the $DR_{(RSSI)}$ may be chosen to align with the sensitivity of LNA 210, while $G_1$ is independently scaled for noise.

In some embodiments, the gains G of amplifier stages 212-215 are equal to each other, but are different from gain $G_1$. By making the gains G of amplifier stages 212-215 the same, linearity is improved and detection error is reduced.

Since the gains of amplifier stage 211-215 are known, the inventors have discovered that selecting the output of only one of amplifier stages 212-215 having a desired linear range can be used to determine the RSSI of the IF_IN signal. For example, if the output of stage 214 demonstrates the desired linear range, then linear point detection circuit 241 can choose its input to multiplexer 242 as the detected RSSI signal. As will be explained further below, linear point detection circuit 241 detects the first amplifier in the amplifier chain in an order from amplifier stage 212 to amplifier stage 215 whose RSSI component exceeds the prior RSSI component by more than a threshold. In this way, the RSSI signal will be free of saturation at either the low end or the high end of the gain range and will be substantially linear in the middle.

Amplifier 251 applies a final gain equal to 1+(R2/R1) to its output that is connected to the input of ADC 255. The values for R1 and R2 can be determined by simulation or characterization, or can be made programmable and set using calibration during operation to place the analog signal at the ideal point at the input of ADC 255.

ADC 255 converts the analog signal to a digital signal representation of the receive signal strength. This receive signal strength can be adjusted in the digital domain based on the gain stage that produced the output having the desired linear range.

Contrary to conventional RSSI detection methods with voltage-current-voltage based conversion, such as RSSI circuit 100 of FIG. 1, RSSI circuit 220 uses a voltage-only based signal detection with ultra-low power consumption, as well as a novel method to determine the linear range of operation without multi cycle count calculations. The low-power envelope detection based method used by RSSI circuit 220 generates an analog output voltage representative of the RSSI of IF_IN on the order of a few microseconds, while providing a fast-settling output.

Integrated LNA and RSSI circuit 200 provides several advantages over known circuits. First, it has a small device footprint thanks to the simple architecture, thus saving silicon area and reducing cost. In particular, the limiting amplifier formed by amplifier stages 212-215 is shared between LNA 210 and RSSI circuit 220, avoiding the need to duplicate its circuitry.

Second, since there are no large RC loads on the output of the gain stages and the signal strength is measured in the voltage domain, it operates at high speed with very low power consumption. As will be explained further below, in some embodiments it further uses an envelope detector that has high input impedance and small capacitance due to small MOS transistors used as source followers.

Third, since LNA 210 uses single-ended gain stages with integral band-pass filters, it avoids the problem of offset voltage multiplication through a long amplifier chain and avoids the need for an offset cancellation loop and the extra settling time required by such a loop. Each amplifier stage is connected to a subsequent amplifier stage using blocking capacitors that block the DC component and prevent the need for DC offset cancellation.

Figure 3:
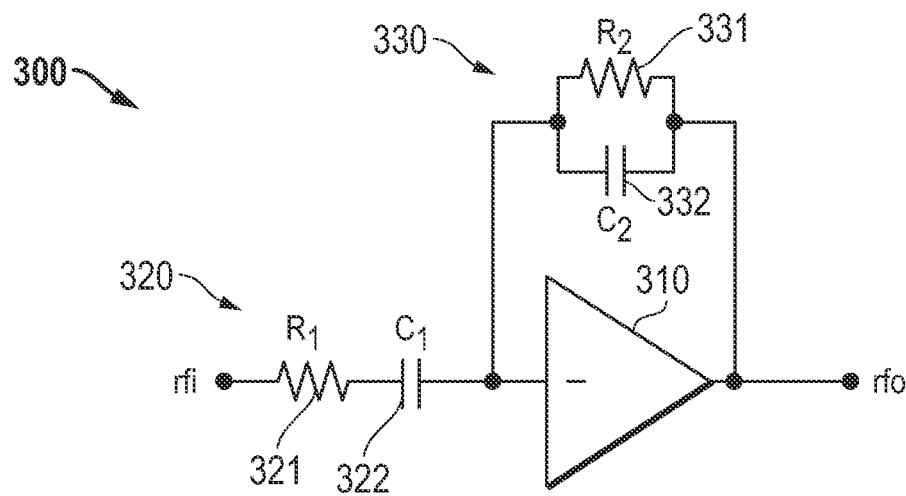
FIG. 3 illustrates in partial block diagram and partial schematic form a gain stage suitable for use as one of the gain stages in the low noise amplifier of FIG. 2.

FIG. 3 illustrates in partial block diagram and partial schematic form an amplifier stage 300 suitable for use as one of the amplifier stages in LNA 210 of FIG. 2. Amplifier stage 300 includes generally a single-ended amplifier 310, a first passive network 320, and a second passive network 330. Single-ended amplifier 310 has an inverting input, and an output for providing an amplified signal, shown here as a low-RF signal labeled "rfo". First passive network 320 includes a resistor 321 and a capacitor 322 connected in series. Resistor 321 has a first terminal for receiving a low-RF input signal labelled "rfi", and a second terminal, and has an associated resistance labelled "$R_1$". Capacitor 322 has a first terminal connected to the second terminal of resistor 321, and a second terminal connected to the inverting input terminal of single-ended amplifier 310, and has an associated capacitance labelled "$C_1$". Second passive network 330 includes a resistor 321 and a capacitor 322 connected in parallel. Resistor 331 has a first terminal connected to the inverting input of single-ended amplifier 310, and a second terminal connected to the output of single-ended amplifier 310, and has an associated resistance labelled "$R_2$". Capacitor 322 has a first terminal connected to the inverting input of single-ended amplifier 310, and a second terminal connected to the output of single-ended amplifier 310, and has an associated capacitance labelled "$C_2$".

In operation, capacitor 322 blocks any DC level of the rfi signal from being amplified by amplifier stage 300, and the DC level of amplifier stage 300 is set solely by single-ended amplifier 310. By using amplifier stage 300, LNA 210 of FIG. 2 avoids the need for DC offset cancellation that is required in conventional multi-stage differential amplifier designs such as a limiting amplifier, simplifying the circuitry for LNA 210 and allowing faster settling time for receive signal strength measurements compared to limiting amplifier 110 of FIG. 1.

In addition, the components of first passive network 320 and second passive network 330 give amplifier stage 300 a bandpass characteristic, such that the combination of serially-connected amplifier stages in LNA 210 of FIG. 2 has an overall bandpass characteristic that imitates a high-order bandpass filter. Thus, by using amplifier stages 300 for each of stages 211-215, LNA 210 creates a distributed a high-quality bandpass characteristic without providing a separate complex analog filter.

Figure 4:
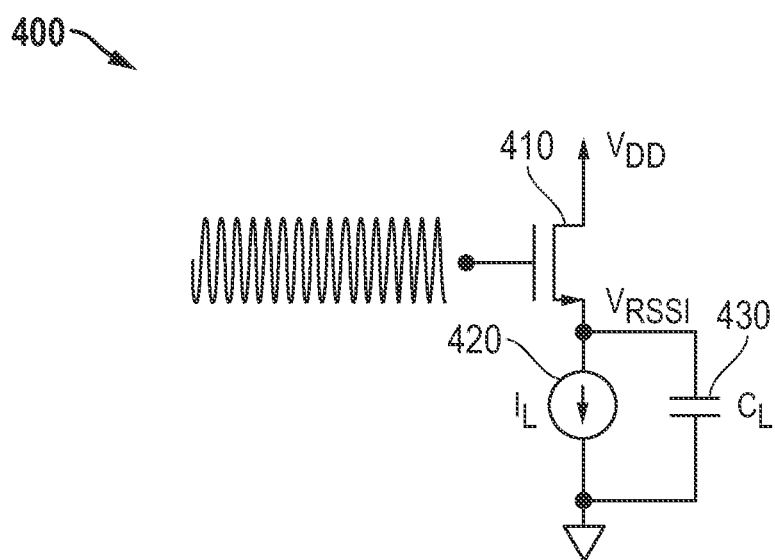
FIG. 4 illustrates in schematic form an envelope detector circuit that can be used as an envelope detector circuit in the receive signal strength indicator circuit of FIG. 2.

FIG. 4 illustrates in schematic form an envelope detector circuit 400 that can be used as an envelope detector circuit in receive signal strength indicator circuit 220 of FIG. 2. Envelope detector circuit 400 includes a transistor 410, a current source 420, and a capacitor 430. Transistor 410 is an N-channel metal-oxide-semiconductor (MOS) field effect having a drain connected to a power supply voltage terminal labelled "$V_{DD}$", a gate forming an input of the envelope detector circuit and receiving the amplified signal of a corresponding one of the serially-coupled amplifier stages of LNA 210 of FIG. 2, and a source for providing a receive signal strength indicator component labelled "$V_{RSSI}$". Current source 420 has a first terminal connected to the source of transistor 410, and a second terminal connected to ground. Capacitor 430 has a first terminal connected to the source of transistor 410, and a second terminal connected to ground.

Unlike the diode-based envelope detector circuits in envelope detector stage 230 shown in FIG. 2, envelope detector circuit 400 uses an N-channel MOS transistor in a source follower configuration to generate $V_{RSSI}$. Since the source of transistor 410 only drives either an inactive switch (if multiplexer 242 does not select its corresponding input) or the high-impedance input of an operational amplifier 252 (if multiplexer 242 selects its corresponding input), it resolves quickly and consumes no DC power, thus contributing to lower overall power consumption. Moreover, transistor 410, current source 420, and capacitor 430 can be made small to further reduce circuit area and improve settling time.

Figure 5:
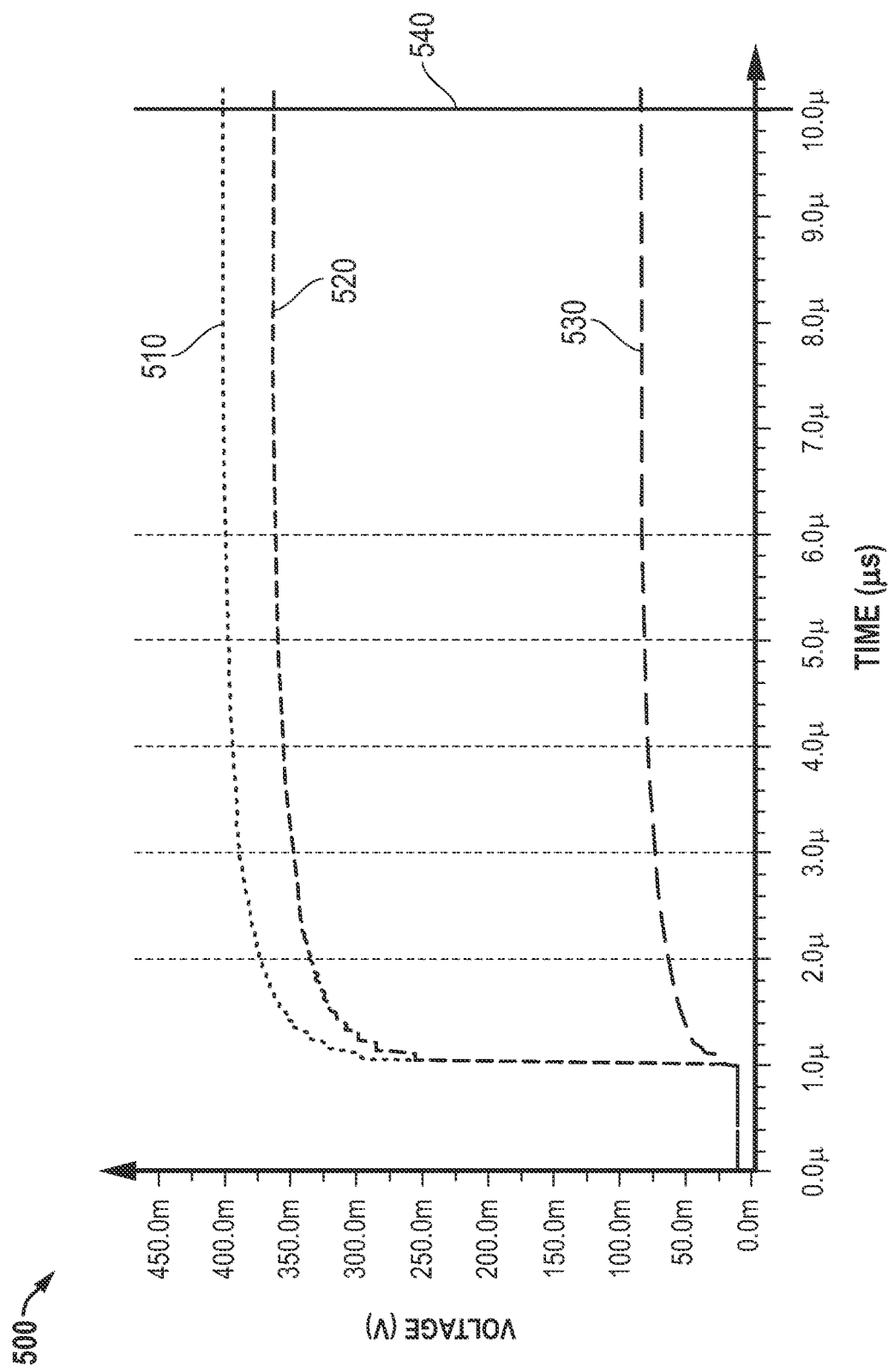
FIG. 5 illustrates a timing diagram showing the settling time of the receive signal strength indicator circuit of FIG. 2.

FIG. 5 illustrates a timing diagram 500 showing the settling time of receive signal strength indicator circuit 220 of FIG. 2. In timing diagram 500, the horizontal axis represents time in microseconds (μs), and the vertical axis represents voltage in volts. Shown in timing diagram 500 are three waveforms of interest, including a first waveform 510 representing a 50 μV peak-to-peak input, a second waveform 520 representing a 10 μV peak-to-peak input, and a third waveform 530 representing a 0 μV peak-to-peak input signal. Also shown in timing diagram 500 is a time point at about 10 μs at which time the peak detection measurement has settled for all three inputs. Timing diagram 500 also shows that the input peak signal level versus output voltage shows a logarithmic characteristic, which can be easily corrected in the digital domain to obtain a linear RSSI measurement.

Figure 6:
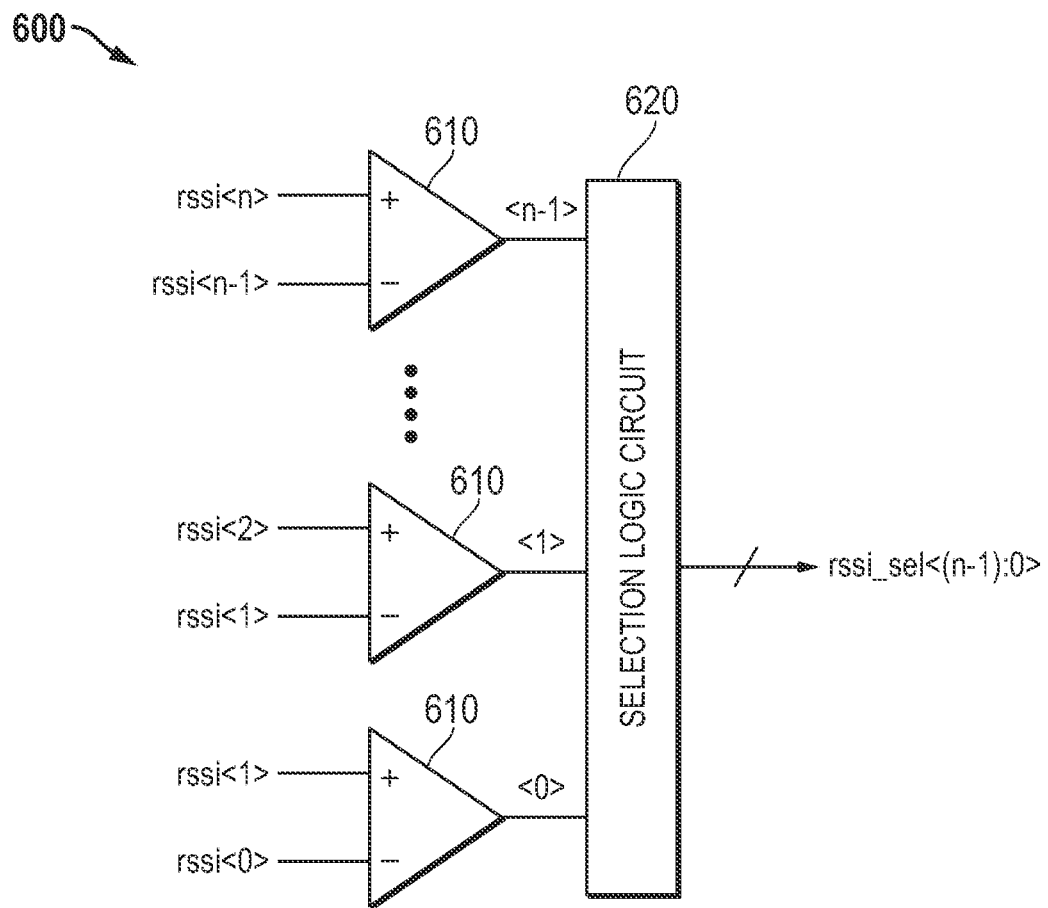
FIG. 6 illustrates in block diagram for a linear point detection circuit suitable for use as the linear point detection circuit of FIG. 2.

FIG. 6 illustrates in block diagram for a linear point detection circuit 600 suitable for use as linear point detection circuit 241 of FIG. 2. Linear point detection circuit 600 includes a set of comparator circuits 610 and a selection logic circuit 620. Each of comparator circuits 610 compares the two adjacent RSSI components and provides an output based on a difference between the two exceeding a threshold voltage. Thus, a first comparator circuit 610 compares rssi<1> to rssi<0> and provides an output labelled<0> if rssi<1>exceeds rssi<0> by more than the threshold, a second comparator circuit 610 compares rssi<2> to rssi<1> and provides an output labelled<1> if rssi<2>exceeds rssi<1> by more than the threshold, and so on until a last comparator circuit 610 compares rssi<n> to rssi<n−1> and provides an output labelled<n−1> if rssi<n>exceeds rssi<n−1> by more than the threshold. Selection logic circuit 620 looks for the pattern of changes in the measured rssi value that indicates the signal strength is in a desired linear range. In that case, selection logic circuit 620 picks that output as representative of the input signal and activates a corresponding control signal to control an analog switch in multiplexer 242 to pass the selected RSSI component to the output.

Figure 7:
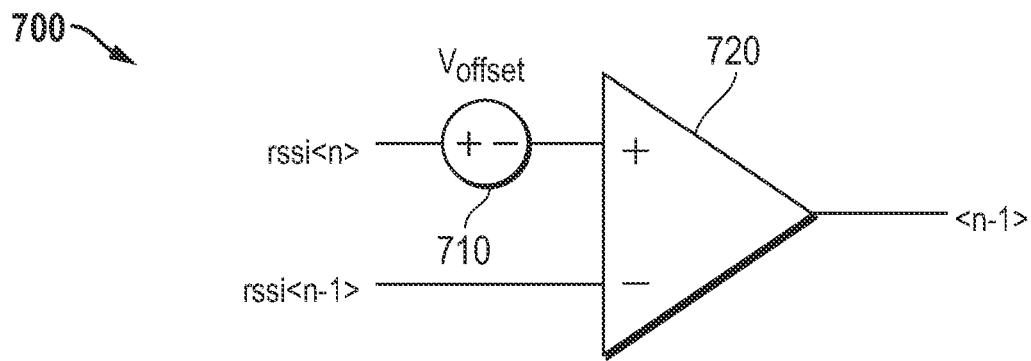
FIG. 7 illustrates in block diagram form a comparator circuit that can be used as any one of the comparator circuits of FIG. 6.

FIG. 7 illustrates in block diagram form a comparator circuit 700 that can be used as any one of comparator circuits 610 of FIG. 6. Comparator circuit 700 compares rssi<n> to rssi<n−1> and includes an offset voltage source 710 and a comparator 720. Offset voltage source 710 has a positive terminal for receiving rssi<n>, and a negative terminal, and generates a voltage difference labelled "$V_{offset}$" between the positive and negative terminals thereof. Offset voltage source 710 can be implemented by any of a number of circuits or circuit elements such as a diode, a diode-connected MOS transistor, etc. Comparator 720 has a positive input terminal connected to the negative terminal of offset voltage source 710, a negative input terminal for receiving rssi<n−1>, and an output terminal for providing a signal labelled "<n−1>". Comparator 720 is a near-ideal voltage comparator with low offset voltage and high gain for forming substantially discrete output logic states. Because of the voltage reduction provided by offset voltage source 710, comparator 720 provides the <n−1>signal at a logic high if $V_{(rssi<n>)} - V_{offset} > V_{(rssi<n-1>)}$, and at a logic low otherwise.

The unbalanced structure of comparator circuit 700 reduces the overall RSSI measurement time to an amount of time within one conversion cycle of ADC 255, providing near real-time determination of the linear output of the RSSI chain without requiring a multiple-cycle ADC conversion, and validates the RSSI output with minimum number of cycles during continuous operation. This advantage can be seen especially during short bursts of data frames that occur during alternating receive and transmit operation.

Figure 8:
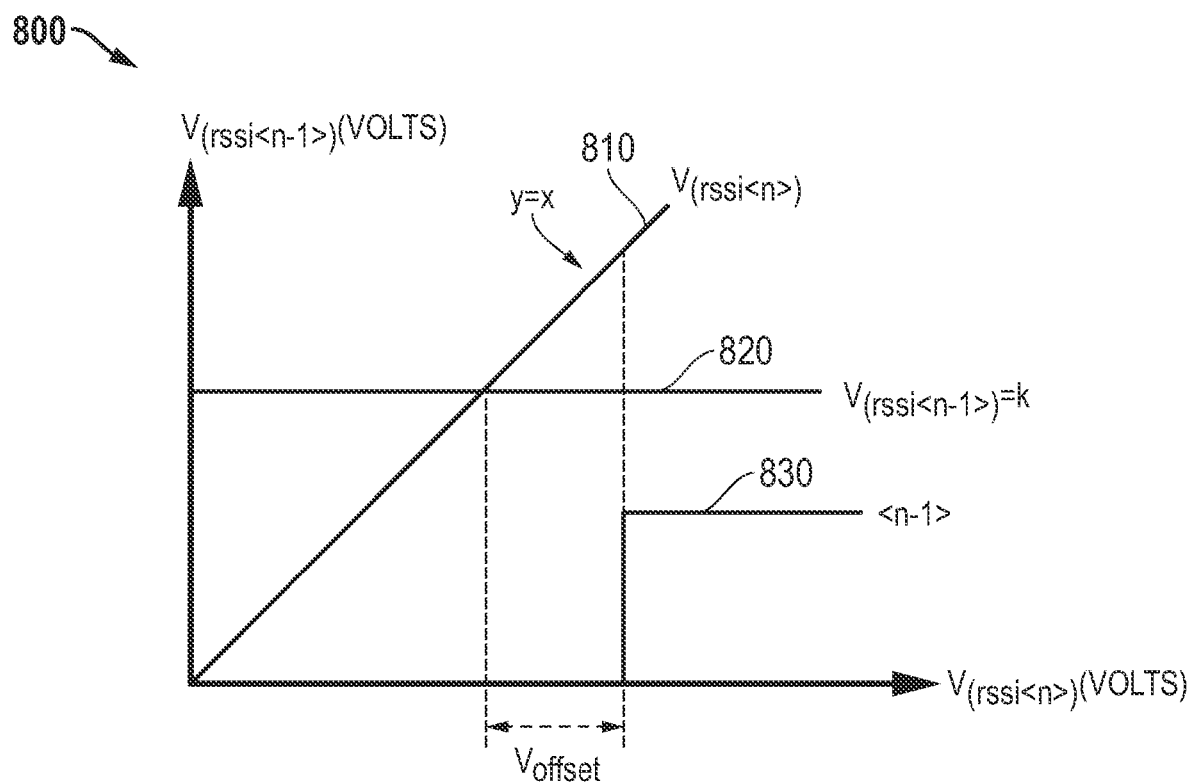
FIG. 8 illustrates a graph showing the relationship between the two input voltages and the output voltage of the comparator circuit of FIG. 7.

FIG. 8 illustrates a graph 800 showing the relationship between the two input voltages and the output voltage of comparator circuit 720 of FIG. 7. In graph 800, the horizontal axis represents $V_{(rssi<n>)}$ in volts, and the vertical axis represents $V_{(rssi<n-1>)}$ in volts. A line 810 illustrates the points at which $V_{(rssi<n>)} = V_{(rssi<n-1>)}$. A line 820 illustrates the values of $V_{(rssi<n>)}$ when $V_{(rssi<n-1>)}$ equals a particular voltage labelled "k". A waveform 830 illustrates the value of <n−1> at various values of $V_{(rssi<n>)}$. Waveform 830 shows that the <n−1>signal has a high logic state when $V_{(rssi<n>)} = V_{(rssi<n-1>)} + V_{offset}$, and a logic low state otherwise. Thus, the <n−1>signal is active to indicate that there is a difference between successive rssi components of at least a certain magnitude, namely $V_{offset}$. In this case, the corresponding envelope detector circuit is in a desired linear range for estimating the overall receive signal strength of the input signal. Linear point detection circuit 241 selects the first RSSI component in an order from the least significant (earlier stage in the amplifier chain with less gain applied) to the most significant (later stage in the amplifier chain with more gain applied) having the desired linear range. The comparison measurements are decided very quickly and the validity of the rssi selection and measurement is limited only by settling time shown in FIG. 5, thus allowing a rapid RSSI measurement.

The above-disclosed subject matter is to be considered illustrative, and not restrictive, and the appended claims are intended to cover all such modifications, enhancements, and other embodiments that fall within the scope of the claims. For example, the low-noise amplifier can be used both as a limiting amplifier for a receive signal strength indicator (RSSI) circuit and a signal amplifier, whereas in other embodiments it can be used for one or the other purpose. If used for both purposes, the limiting amplifier can be formed using only a portion of the LNA, for example, it can exclude an initial gain stage and an output level shifter that are used in the signal amplifier. The LNA can be used in either an IF or low-RF signal processing, in which the low-RF can be, for example, on the order of tens of MHz.

Thus, to the maximum extent allowed by law, the scope of the present invention is to be determined by the broadest permissible interpretation of the following claims and their equivalents, and shall not be restricted or limited by the forgoing detailed description.

What is claimed is:

1. A low noise amplifier, comprising:
  a plurality of serially-coupled amplifier stages each providing a respective amplified signal, wherein a first amplifier stage receives an input signal, and a last amplifier stage provides an amplified output signal;
  wherein each of said plurality of serially-coupled amplifier stages comprises:
    a single-ended amplifier having an input, and an output providing said respective amplified signal;
    a first passive network having a first terminal forming an input of a respective one of said plurality of serially-coupled amplifier stages, and a second terminal coupled to said input of said single-ended amplifier, said first passive network comprising a first capacitor coupled in series between said first and said second terminals of said first passive network, wherein said first passive network further comprises a first resistor having a first terminal coupled to said input of said respective one of said plurality of serially-coupled amplifier stages, and a second terminal, and said first capacitor has a first terminal coupled to said second terminal of said first resistor, and a second terminal coupled to said input of said single-ended amplifier; and
    a second passive network coupled in parallel to said single-ended amplifier and between said input and said output of said single-ended amplifier, comprising a second resistor having a first terminal coupled to said input of said single-ended amplifier, and a second terminal coupled to said output of said single-ended amplifier, and a second capacitor having a first terminal coupled to said input of said single-ended amplifier, and a second terminal coupled to said output of said single-ended amplifier.

2. The low noise amplifier of claim 1, wherein each of said single-ended amplifier of each of said plurality of serially-coupled amplifier stages is an inverting amplifier.

3. The low noise amplifier of claim 1, wherein components of said first passive network and said second passive network give said respective one of said plurality of serially-coupled amplifier stages a bandpass filter characteristic.

4. A circuit, comprising:
a low noise amplifier comprising a plurality of serially-coupled amplifier stages each providing a respective amplified signal, wherein a first amplifier stage receives an input signal, and a last amplifier stage provides an amplified output signal, wherein each of said plurality of serially-coupled amplifier stages comprises:
a single-ended amplifier having an input, and an output providing said respective amplified signal;
a first passive network having a first terminal forming an input of a respective one of said plurality of serially-coupled amplifier stages, and a second terminal coupled to said input of said single-ended amplifier, said first passive network comprising a first capacitor coupled in series between said first and said second terminals of said first passive network; and
a second passive network coupled in parallel to said single-ended amplifier and between said input and said output of said single-ended amplifier; and
a receive signal strength indicator circuit coupled to said plurality of serially-coupled amplifier stages to provide a receive signal strength output signal indicative of a strength of a signal at an input of a first one of said plurality of serially-coupled amplifier stages.

5. The circuit of claim 4, wherein said single-ended amplifier is an inverting amplifier.

6. The circuit of claim 4, wherein said first passive network comprises:
a first resistor having a first terminal coupled to said input of a respective one of said plurality of serially-coupled amplifier stages, and a second terminal,
wherein said first capacitor has a first terminal coupled to said second terminal of said first resistor, and a second terminal coupled to said input of said single-ended amplifier.

7. The circuit of claim 6, wherein said second passive network comprises:
a second resistor having a first terminal coupled to said input of said single-ended amplifier, and a second terminal coupled to said output of said single-ended amplifier; and
a second capacitor having a first terminal coupled to said input of said single-ended amplifier, and a second terminal coupled to said output of said single-ended amplifier.

8. The circuit of claim 4, further comprising:
an initial amplifier stage,
wherein gains of each of said plurality of serially-coupled amplifier stages are equal to each other but different from a gain of said initial amplifier stage.

9. The circuit of claim 4, further comprising:
a level shifter having an input coupled to a last one of said plurality of serially-coupled amplifier stages, and an output for providing a level-shifted amplified output signal.

10. The circuit of claim 4, wherein said receive signal strength indicator circuit provides said receive signal strength output signal in response to an output of one of said plurality of serially-coupled amplifier stages.

11. The circuit of claim 10, wherein said receive signal strength indicator circuit provides said receive signal strength output signal in response to a detected envelope of said output of said one of said plurality of serially-coupled amplifier stages.

12. The circuit of claim 10, wherein said receive signal strength indicator circuit selects said one of said plurality of serially-coupled amplifier stages based on a desired linear range.

13. A method, comprising:
receiving an input signal at an input of a first one of a plurality of successive amplifier stages;
amplifying said input signal in said plurality of successive amplifier stages, wherein for each of said plurality of successive amplifier stages, said amplifying comprises:
receiving a single-ended input signal at an input of a respective amplifier stage;
filtering said single-ended input signal using a first passive network having a first terminal receiving said single-ended input signal and a second terminal;
amplifying a signal at said second terminal of said first passive network to provide an output signal to an output terminal of said respective amplifier stage; and
filtering said output signal using a second passive network having a first terminal for receiving said output signal, and a second terminal coupled to said second terminal of said first passive network, and
providing an output signal in response to said output signal of a last one of said plurality of successive amplifier stages; and
providing a receive signal strength indicator signal in response to said output of a selected one of said plurality of successive amplifier stages.

14. The method of claim 13, wherein passing said single-ended input signal from said first terminal to said second terminal of said first passive network comprises:
passing said single-ended input signal through a series combination of a first resistor and a first capacitor coupled in series between said first and said second terminals of said first passive network.

15. The method of claim 14, wherein filtering said output signal using said second passive network comprises:
filtering said output signal through a parallel combination of a second resistor and a second capacitor each coupled between said first and said second terminals of said second passive network.

16. The method of claim 13, further comprising:
amplifying one of a radio frequency (RF) signal or an intermediate frequency (IF) signal in an initial amplifier stage and providing said input signal in response to said amplifying according to a first gain,
wherein said amplifying comprises negatively amplifying using second gains equal to each other but different from a said first gain.

17. The method of claim 13, further comprising:
level shifting said output signal to provide a level-shifted output signal.

18. The method of claim 13, wherein:
said amplifying said signal at said second terminal of said first passive network comprises amplifying said signal at said second terminal of said first passive network to provide said output signal to said output terminal of a respective amplifier stage.

* * * * *